US006815744B1

United States Patent
Beck et al.

(10) Patent No.: US 6,815,744 B1
(45) Date of Patent: Nov. 9, 2004

(54) MICROELECTRONIC DEVICE FOR STORING INFORMATION WITH SWITCHABLE OHMIC RESISTANCE

(75) Inventors: Armin Beck, Au (CH); Coorg Bednorz, Wolfhausen (CH); Christoph Gerber, Richterswil (CH); Christophe P. Rossel, Richterswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/913,723

(22) PCT Filed: Jan. 17, 2000

(86) PCT No.: PCT/IB00/00043

§ 371 (c)(1),
(2), (4) Date: Oct. 18, 2001

(87) PCT Pub. No.: WO00/49659

PCT Pub. Date: Aug. 24, 2000

(30) Foreign Application Priority Data

Feb. 17, 1999 (WO) ................................ PCT/IB99/00283

(51) Int. Cl.$^7$ .............................................. H01L 29/76
(52) U.S. Cl. ....................... 257/295; 257/296; 257/306; 257/310
(58) Field of Search .......................... 257/43, 296, 306, 257/310, 532, 295

(56) References Cited

U.S. PATENT DOCUMENTS

| 3,663,458 | A | * | 5/1972 | Masuyama et al. ..... 252/519.52 |
| 4,767,729 | A | * | 8/1988 | Osman et al. ................. 264/616 |
| 5,623,439 | A | * | 4/1997 | Gotoh et al. ................. 365/145 |
| 5,723,885 | A | * | 3/1998 | Ooishi ......................... 257/295 |
| 5,731,220 | A | * | 3/1998 | Tsu et al. ..................... 438/782 |
| 5,840,110 | A | * | 11/1998 | Azuma et al. ............ 106/287.18 |
| 5,907,470 | A | * | 5/1999 | Kita et al. .................... 361/311 |
| 6,128,178 | A | * | 10/2000 | Newns ......................... 361/305 |
| 6,139,780 | A | * | 10/2000 | Desu et al. ................... 252/584 |
| 6,204,069 | B1 | * | 3/2001 | Summerfelt et al. ........... 438/3 |
| 6,204,139 | B1 | | 3/2001 | Liu et al. ..................... 438/385 |

FOREIGN PATENT DOCUMENTS

| JP | 05291583 A | * | 11/1993 |
| JP | 06350100 A | * | 12/1994 |
| JP | 10036171 A | * | 2/1998 |

OTHER PUBLICATIONS

Watanabe et al., Epitaxial all–perovskite ferroelectric field effect transistor with a memory retention, Appl. Phys. Lett., 66 (Apr. 1995) 1770.*
Auciello et al., The physics of ferroelectric memories, Physics Today, 51 (Jul. 1998) 22.*
Bednorz et al., "Novel two–dimensional perovskites", High–Tc Superconductivity 1996: Ten Years after the Discovery, (Kluwer Academic Publishers, 1997), pp. 95–108.*
Hiatt et al., Bistable switching in niobium oxide diodes, Appl. Phys. Lett., 6 (Mar. 1965) 106.*

* cited by examiner

Primary Examiner—Richard Elms
Assistant Examiner—Christian D. Wilson
(74) Attorney, Agent, or Firm—Derek S. Jennings; Anne V. Dougherty

(57) ABSTRACT

A microelectronic device is designed such that it includes a region between electrodes having a switchable ohmic resistance wherein the region is made of a substance comprising components $A_x$, $B_y$, and oxygen $O_z$. The ohmic resistance in the region is reversibly switchable between different states by applying different voltage pulses. The different voltage pulses lead to the respective different states. An appropriate amount of dopant(s) in the substance improves the switching, whereby the microelectronic device becomes controllable and reliable.

27 Claims, 6 Drawing Sheets

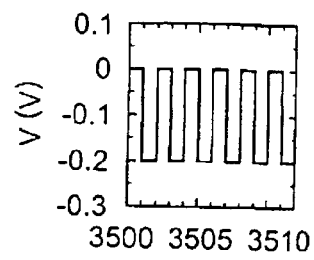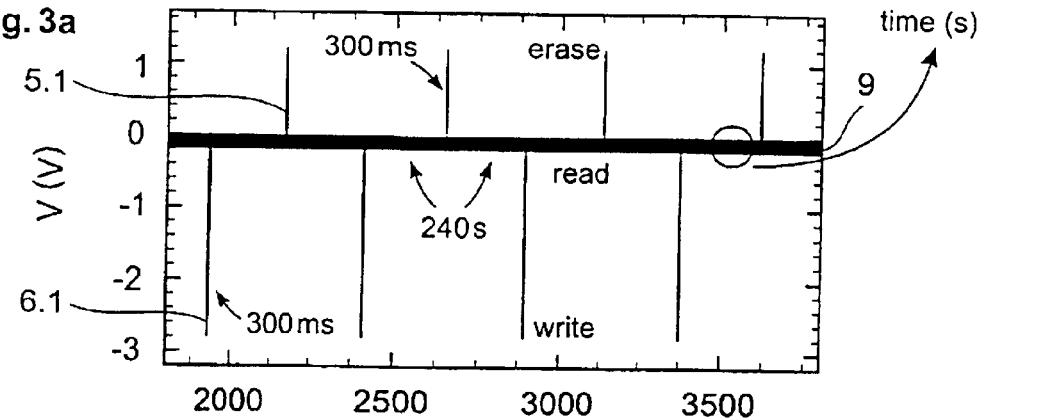
Fig. 3a
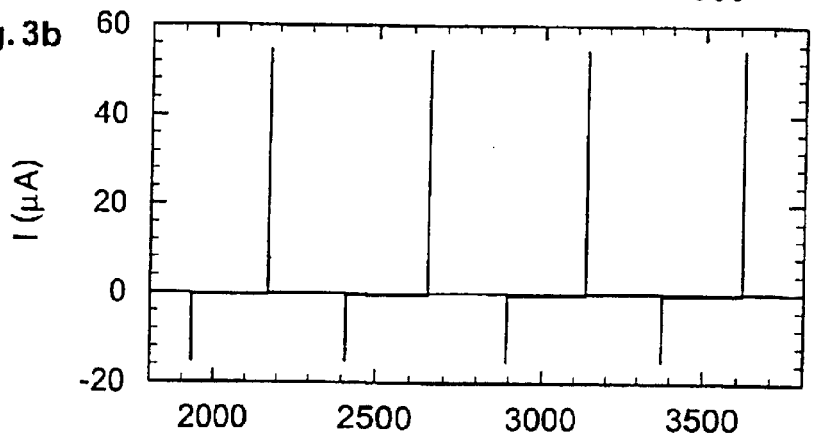
Fig. 3b
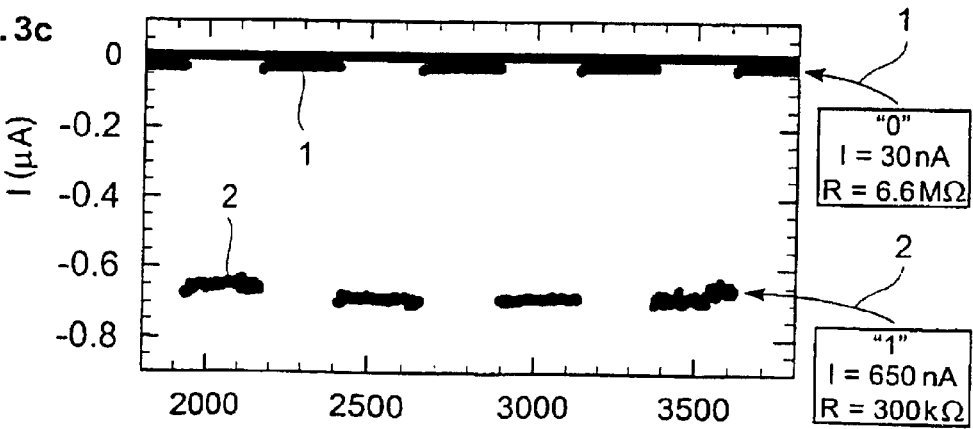
Fig. 3c

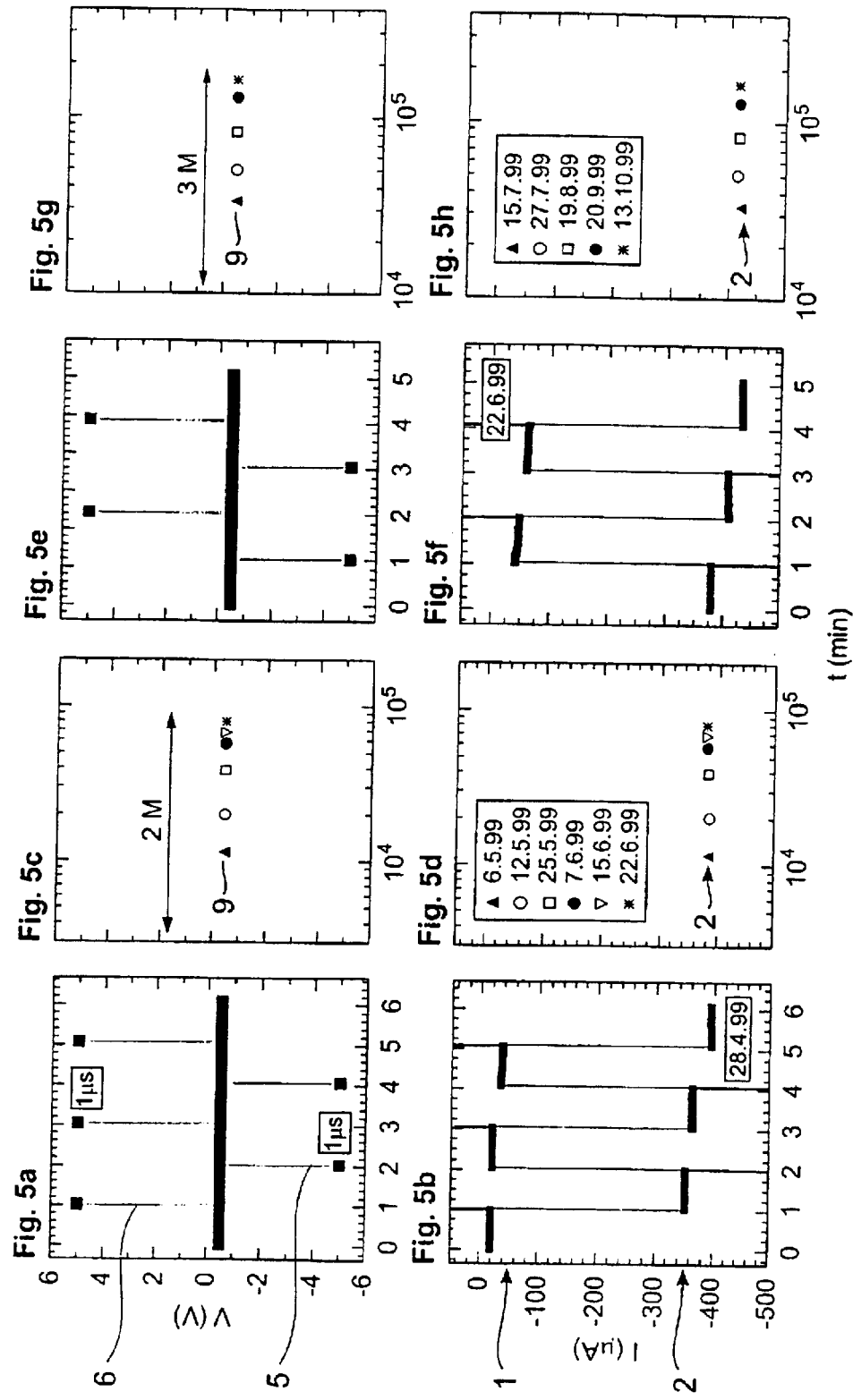

MICROELECTRONIC DEVICE FOR STORING INFORMATION WITH SWITCHABLE OHMIC RESISTANCE

BACKGROUND OF THE INVENTION

1. Field of the Invention

The present invention relates to electronic and microelectronic devices. In particular, the present invention relates to a plurality of materials showing a switching phenomenon and a built-in memory by the aid of which a new principle of storing and reading information in memory cells of semiconductor chips and a plurality of fundamental improvements on electronic or microelectronic devices can be achieved.

2. Description and Disadvantages of Prior Art

Although the present invention is applicable in a broad variety of microelectronic or electronic applications it will be described with the focus put on an application to memory cells as RAM (Random Access Memory), for example.

The need to remain cost and performance competitive in the production of semiconductor devices has caused continually increasing device density in integrated circuits. To facilitate the increase in device density, new technologies are constantly needed to allow the feature size of these semiconductor devices to be reduced.

Conventional DRAM cells, whereby DRAM stand for Dynamic Random Access Memory, consist of a transistor and a capacitor mostly made from Silicon dioxide (SiO2). They need the transistor to control the inflow and outflow of charge stored in the capacitor as the physical quantity exploitable for storing information. Said transistor also decouples the capacitors from each other. Such DRAM cells have the disadvantage, that information stored therein is volatile and as such can principally be lost on each power supply failure. Further, the time needed to refresh the information contained in DRAM cells delimits the read and write performance of such cells. Finally, the structure of such a DRAM cell is quite complex due to the required transistor.

Thus, a change in computer RAM technology beyond conventional DRAM technology would be desirable.

The use of ferroelectric non-volatile RAM (NVRAM) cells would already be a great step forward as information would not be lost on any power failure although the structure of the memory cell would remain complex, too. In such ferroelectric RAMs the polarization of the bit storing layer is exploited instead of a capacitor's capacity in DRAM cells for defining two different states which can be associated with two different logical values. A long term repetitive switching between two different states of remanent polarization, however, fatigues the ferroelectric properties of the material, as e.g. lead zirconium lot titanate (PZT).

In 'Physics Today' July 1998, page 24 a further high permittivity material and a respective semiconductor fabricating technology is proposed which allows the computer industry to use the equipment of its conventional DRAM manufacturing plants without having to perform basic retooling. It is the so-called high permittivity DRAM technology.

Herein, the charge of a capacitor can be used to store information as it is done in conventional DRAM technology as the polarization of a high permittivity layer depends linearly on the applied voltage, as required for charging the DRAM capacitors. A high permittivity material as e.g. barium strontium titanate (BST) having a permittivity er about 500 instead of er about 4 for silicon dioxide would allow to reduce the space needed for the capacitor as its capacitance is proportional to its area and the magnitude of its permittivity value. This in turn would allow higher integration levels compared to conventional silicon oxide materials used in DRAM cells as the capacitor's area consumption is large as compared to that of the coupled transistor.

But, nevertheless, as a disadvantage remains that the leakage current is still significant.

Thus, refreshing is a must.

Investigations in the sixties at oxide diodes and thin oxide films revealed several phenomena. For example, J. F. Gibbons and W. E. Beadle reports in their article "Switching properties of thin NiO films", Solid-State Electronics, Pergamon Press 1964, Vol. 7, pp. 785–797, about a two-terminal solid-state switch made from a thin film of nickel oxide. After about 100–1000 switching cycles, the device could not be switched out of an ON condition with normal switching signal amplitudes. Other tests on oxide diodes were performed whereby switching was induced by applying high voltages. These diodes broke down after a few cycles and became unusable. T. W. Hickmott reports in Applied Physics Letters, Vol. 6, No. 6, on page 106 and in the Journal of Vacuum Science and Technology, Vol. 6, No. 5 on page 828 about bistable switching in Niobium oxide diodes. He noticed that the metal electrode plays an important role. To sum up, the tested devices and materials showed that they were either difficult to control or unreliable.

In U.S. Pat. No. 4,931,763 a memory switch is described that bases on metal oxide thin films. The memory switch is irreversible and therefore only switches once. It can be used as connection element in circuits and arrays but not for storing of changing information.

Finally, with increasing integration near and beyond the 1 Gbit chip due to smaller capacitor size the area consumption of the transistor of a memory cell is not negligible anymore. Thus, a great step forward to Ultra Large Scale Integration (ULSI) would be to simplify the structure of a memory cell as much as possible.

OBJECTS OF THE INVENTION

Therefore, an object of the present invention is to provide a robust simply structured, reliable and non-volatile memory cell.

It is another object of the present invention to provide a new simpler method for stable storage of information into such a memory cell and a reproducible erasing and reading from it.

It is another object of the present invention to provide a simply structured and non-volatile memory cell which is able to store more than only two distinct values, i.e., which is usable for multilevel storage.

SUMMARY AND ADVANTAGES OF THE INVENTION

These objects of the invention are achieved by the features stated in the following description and claims.

The basic discovery underlying the present invention concerns a plurality of doped oxide substances including perovskites and related compounds, i.e. materials, for use in microelectronic devices and in electronic circuits and particularly for use in semiconductor chips which combine both, a switching phenomenon in resistance and a built-in memory.

A feature of the present invention includes a microelectronic device design such that it comprises a region between electrodes having a switchable ohmic resistance wherein the region is made of a substance comprising components Ax, By, and oxygen Oz. The ohmic resistance in the region is reversibly switchable between different states by applying different voltage pulses. The different voltage pulses lead to the respective different states. An appropriate amount of dopant(s) in the substance improves the switching, whereby the microelectronic device becomes controllable and reliable.

In general and coinciding with the wording of the claims substances are meant comprising components A x, B y, and oxygen Oz, in which substance said component A is a member of Alkaline metals (group IA in the periodic system of elements), or Alkaline Earth metals (group IIA), or Rare Earth elements, or Scandium, or Yttrium, said component B is a transition metal being member of one of the groups IB to VIII, or a member of one of the groups IIIA, IVA, VA and the substance has a crystalline structure.

Various other objects, features, and attendant advantages of the present invention will become more fully appreciated as the same becomes better understood when considered in conjunction with the accompanying drawings, in which like reference characters designate the same or similar parts throughout the several views.

BRIEF DESCRIPTION OF THE DRAWINGS

The present invention is illustrated by way of example and is not limited by the shape of the figures of the accompanying drawings.

FIGS. 3A to 3C show the principles of operation of the capacitor-like structure analyzed in FIGS. 2A to 2C as a memory device in accordance with the present invention.

FIGS. 5A to 5H show results of measurements over an extended time period in accordance with the present invention.

DESCRIPTION OF THE PREFERRED EMBODIMENT

Figure 1:
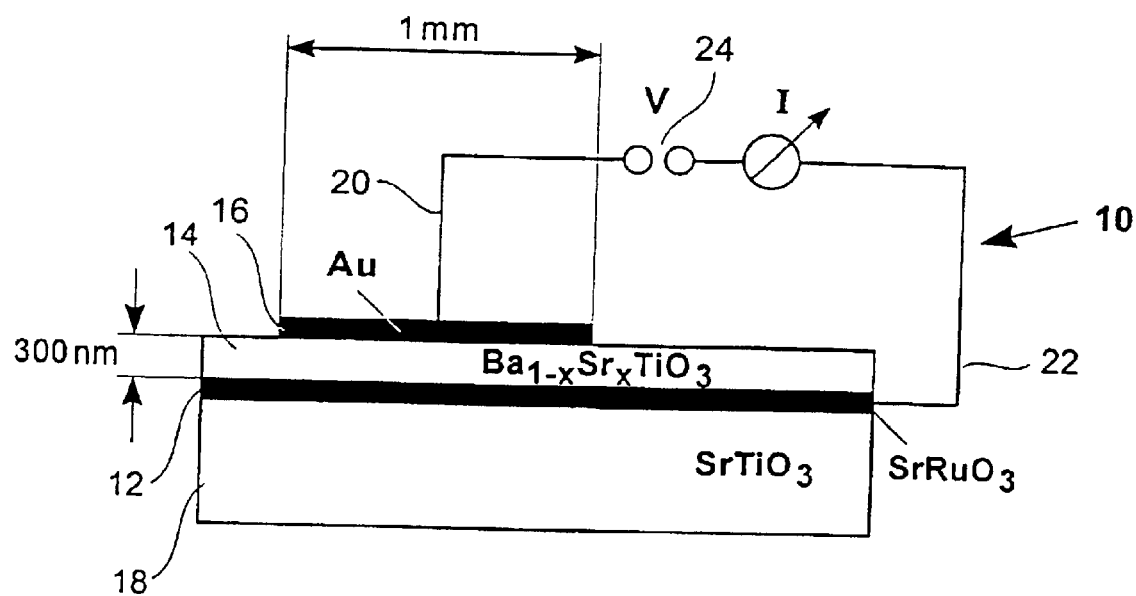
FIG. 1 is a schematic drawing of a perovskite oxide capacitor-like structure of a microelectronic device usable as memory cell in accordance with the present invention.

Generally, an elementary cell of the corresponding lattice structure comprises a cell center molecule which is surrounded by a plurality of oxygen-molecules each having in turn a center molecule. Both types of said center locations can principally be taken by either of the component A, or B, respectively. In other words, there are a plurality of substances, i.e., where chemically appropriate, in which A and B can change their locations. In view of the large plurality of the different usable substances this understanding of the basic formula given above should be stressed in order to assure the intended scope and to conserve clarity and conciseness of the appended claims, a concurrently.

Said substances comprise some specific range of amount of a dopant of one of or a combination of Chromium, Vanadium, or Manganese, or further transition metals.

In particular, any substance comprising components A x, B y, and oxygen Oz, in which substance said component A is a member of Alkaline metals (group IA), or Alkaline Earth metals (group IIA), or Rare Earth elements, or Scandium, or Yttrium, and said component B is a transition metal being member of one of the groups IB to VII, or a member of one of the groups IIIA, IVA, VA are substances which are able to solve the problem underlying to the present invention, when doped with a dopant of one of or a combination of transition metals, in particular but not exclusively with Chromium, Vanadium, or Manganese, the total dopant amount in atomic percentage being larger than 0% and smaller than 5%, and preferably about 0.2% when (BaSr)$TiO_3$ is doped with Chromium only.

Other preferred amounts of dopants are specific for each dopant element used and substance to be doped.

Having found the appropriate amount of dopant(s), a stable switching behavior required to operate a microelectronic device, such as a memory cell, can be provided. Fast write, read and erase processes, similar to time scales that are reached with conventional dynamic memories, are achievable.

Some additional specific requirements should be met by the combination of indices x, y, z in order to find the substances adapted to the present concept. Each of the following items define a subclass of substances which show the desired switching effect:

The combinations of indices x, y and z being defined by x=n+2, y=n+1, z=3n+4, with n=0, 1, 2, 3 reveal the so-called Ruddlesden Popper phases like e.g., $Sr_2RuO_4$ (xyz-index sequence 214) or $Sr_3Ru_2O_7$ (xyz=327) and others.

The combinations of indices as defined above with n=0 contain among others a separate class of substances which adopt a spinell structure as it is e.g., Mg2TiO4 (214), $Cr_2MgO_4$, $Al_2MgO_4$ with A and B positions reversed, i.e. the B cations originally indexed by y are located on the position indexed by x and the A cations on the position indexed by y, or substances with x and y indexing B cations only ($B_2BO_4$), examples are $Fe_2CoO_4$, $Fe_2FeO_4$ ($Fe_3O_4$).

The combinations of indices x, y and z being defined by x=n+1, y=n+1, z=3n+5, with n=1, 2, 3, 4 reveal a separate class of substances which partly provide substances having an oxygen intercalation.

The combinations of indices x, y and z being defined by either of:

x=1, y=1, z=1, and one of the indices x or y being 0, reveal exemplary substances like BeO, MgO, BaO, CaO, . . . NiO, MnO, CoO, CuO, ZnO, or x=n, y=n, z=n+1 with n=1 or 2 and one of the indices x or y being 0, for n=1, reveal substances like TiO2, VO2, MnO2, $GeO_2$, $CeO_2$, $PrO_2$, $SnO_2$, for n=2, reveal substances like $Al_2O_3$, $Ce_2O_3$, $Nd_2O_3$, $Ti_2O_3$, $Sc_2O_3$, $La_2O_3$ or x=n, y=n, z=2n+1 with n=2 and one of the indices x or y being 0, reveal exemplary substances like $Nb_2O_5$, $Ta_2O_5$ and others.

The combinations of indices x, y and z being defined by x=n, y=n, z=3n, with n=1, or 2, or 3 reveal a separate class of substances for n=1 the so-called perovskites, like $SrTiO_3$, $BaTiO_3$, $KNbO_3$, $LiNbO_3$, and others, for n=2 $Sr_2FeMoO_6$ and similar substances are provided having a (226) index sequence.

The combinations of indices x, y and z being defined by x=n+1, y=n, z=4n+1, with n=1, or 2 reveal a separate class of substances.

For n=1 substances having an index sequence (215) like $Al_2TiO_5$, $Y_2MOO_5$ and others are provided, and $SrBi_2Ta_2O_9$ and similars are provided for n=2.

Each of the classes mentioned above can be modified by varying the composition of the substance in order to achieve that at least one of said components Ax or By, respectively, is comprised of a combination of elements out of one group or out of several of the corresponding groups of A, and B, respectively.

A further modification is provided by providing a superlattice made by a combination of structural unit cells and/or sub-unit cells as it is published in 'E. Kaldis et al. (eds.), High-Tc Superconductivity 1996: Ten Years After Discovery, pp. 95–108', having each a different n, and in which structural unit cells and/or sub-unit cells are each a member of a corresponding homologous series obtained by oxygen intercalation. A further modification is provided by providing a superlattice made by a combination of structural unit cells and/or sub-unit cells of the Ruddlesden-Popper type structures having each a different n, and in which said structural unit cells and/or sub-unit cells are each a member of a corresponding homologous series. In said lattice modifications lattice structures are formed in which single or multiple transition metal oxygen octahedra layers are separated by one or more block layers consisting of component A and oxygen.

One preferred member of that plurality of substances is $Ba_xSr_{1-x}TiO_3$ with $0<=x<=0.7$ and having a dopant amount of Chromium in atomic percentage of between 0% and 5%, preferably between 0 and 1%, even more preferably about 0.2%.

Others members of that plurality are materials according to $Ba_xSr_{1-x}TiO_3$ with $0<=x<=0.7$ and having a dopant of Vanadium in atomic percentage of between 0% and 5%.

Manganese is a preferred dopant, too, particularly in composition with Chromium or Vanadium.

Further members of that plurality are perovskite related compounds with other transition metal cations such as Nb. Further dopants can be transition metal elements and combinations thereof, i.e., elements having their valence electron (s) on the d-orbital, i.e., 3d, 4d, or 5d-orbital.

When such a material is used for example as a dielectric layer in a capacitor-like structure to form the microelectronic device, it stays switched in either a high or a low conductivity state depending on a voltage pulse being applied to it until it is switched into the other state by applying a new voltage pulse. Thus, said capacitor-like structure having such a complex dielectric material has a resistance which can be varied by applying short voltage or, alternatively, short current pulses to the embedding electrodes.

As the most decisive electrical property of such a microelectronic device is the change in resistance depending on a defined, applied voltage pulse between the two terminals of the microelectronic device, whereby said capacitor-like structure can be regarded as a 'switchable resistor'. Said switching behavior is known to be effectuated by a voltage or current driven hysteresis behavior.

Due to said property it is possible to store digital information by different values of it resistance, i.e., by associating a high resistance state with a logic '0' and a low resistance state with a logic '1'. The actual state and thus the stored information can be read out by a current readout or measuring the leakage current as it is relatively large with low resistance of the dielectric layer and vice versa. Thus, the leakage current which impedes the performance of prior art DRAM technology can be usefully taken for reading the stored value. According to the invention neither the static charge of a capacitor nor the polarization of any ferroelectric material is needed to be used for storing information but, instead, its resistance.

Thus, a simple way to store information can be followed by realizing the above mentioned concept.

The material usable in connection with the present invention when used for e.g. RAM cells has the advantage, in relation to prior art memory cells, that new cells can be constructed just comprising a single capacitor-like structure device with only one pair of electrode terminals for operating it, i.e. to read from, to write into or to erase without a transistor arrangement being necessarily coupled with a capacitor used in prior art to perform the operating functions of a prior art DRAM cell. One terminal of such a cell is connected to ground and the other is used for writing, erasing or just reading.

Thus, RAM cells can be constructed to use considerably less space on a chip and considerable less manufacturing steps.

Further, the usable material has a remarkable high retention time of at least several months with no power connected and can thus be used as a non-volatile memory. Thus a double advantage can be achieved: first, the full time is available for the read and write processes because the refresh cycles and therefore the refresh circuitry are not required anymore and, secondly, a data storage security is increased as a loss of power supply does not imply a loss of stored data.

Basically, the memory cell can be operated in either a voltage controlled or in a current Fit controlled regime, i.e. information can be stored by applying voltage pulses or by applying current pulses. In both cases the information can be read by sensing voltage or current. For purposes of improved clarity of this disclosure, however, only the voltage regime is described in the detailed description down below.

Finally, for example in the voltage controlled mode the current flowing when reading a '1' compared to that one when reading a '0' value is about 20 times larger due to the difference in resistance. This feature can advantageously be used for storing more than only one bit in the same cell. Thus, a plurality of two, three, or more bits can be stored or removed by applying different voltage pulses, single pulses or sequences thereof having different shape, level, or duration or being different in number to write and erase. A sufficiently large distance between the different levels can hereby be maintained.

With general reference to the figures and with special reference to FIG. 1 the essential structure of a microelectronic device 10 having a capacitor-like structure is described in more detail. Such a microelectronic device 10 is useable as a memory cell.

The microelectronic device 10 comprising an oxide base electrode 12 made from $SrRuO_3$ and a region 14 with an oxide insulator layer made from $(BaSr)TiO_3$ slightly doped with Chromium (Cr) for the insulating material and a metallic Gold (Au) top electrode 16 on a $SrTiO_3$ substrate 18 was fabricated with pulsed laser deposition. The microelectronic device 10 has a thin film capacitor-like structure.

One terminal 20 is connected to said top electrode 16, the other terminal 22 is connected to said base electrode 12.

In an arrangement setup for testing the basic switching behavior and further physical properties of the microelectronic device 10 the insulator layer thickness was 300 nanometers.

The insulator layer of the region 14 was doped with Chromium (Cr) at an amount of The leakage current was measured as it is depicted in the drawing as a function of the bias voltage generated by a DC voltage source 24 between said terminals 20, 22.

Figure 2A:
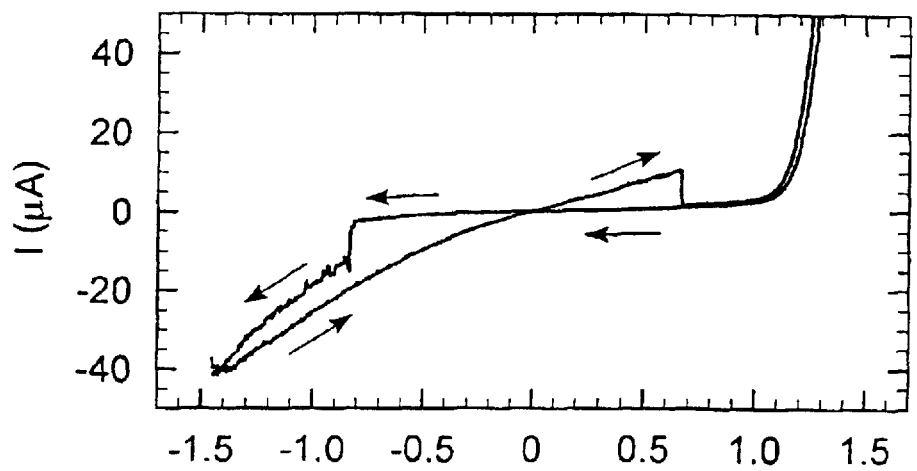
FIGS. 2A to 2C show current-voltage characteristics of a 300 nm thick Cr doped oxide capacitor-like structure in accordance with the present invention.
Figure 2B:
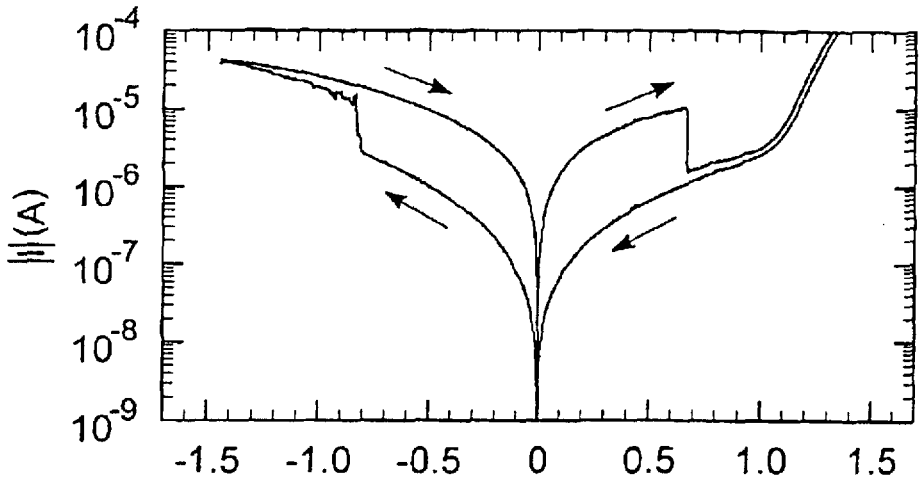
Figure 2C:
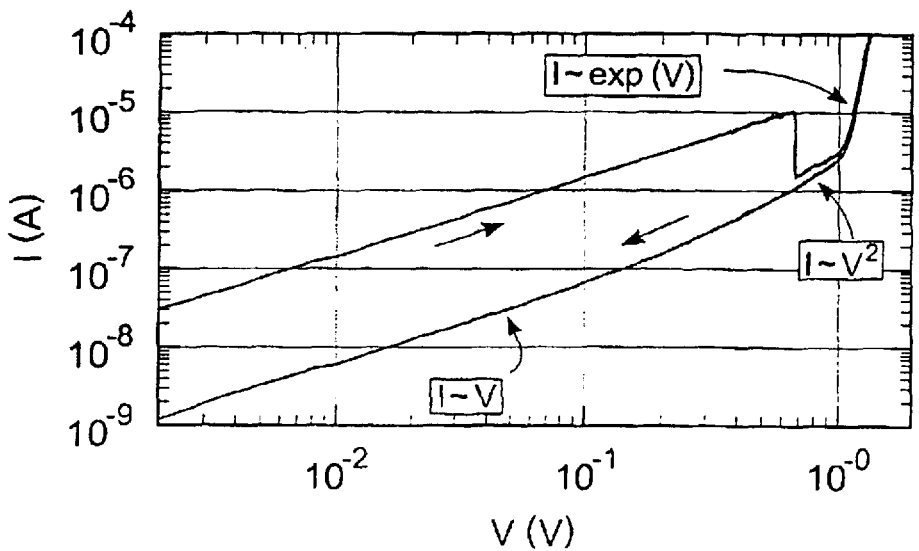

With respect to FIGS. 2A to 2C the leakage current voltage characteristic is illustrated in FIG. 2A linearly, in FIG. 2B with a logarithmic leakage current scale of its absolute amount and in FIG. 2C with both logarithmic scales.

For small applied bias voltages like several 10 mV a linear current voltage characteristic (IVC) can be observed. A quadratic dependence of the current from the applied voltage can be seen for moderate applied voltages as several 100 mV.

This IVC shape and behavior can be described as space charge limited current. Larger applied voltages result in an exponential like rise of the leakage current with increasing applied voltages.

The capacitor-like structure of the microelectronic device 10 shows a reproducible switching behavior causing a hysteresis loop in the current voltage characteristic, described next below:

A large negative bias voltage-negative with respect to the SrRuO3 electrode—leads to a sudden increase of the leakage current, depicted at about −0.8 Volt. Sweeping back to large positive bias voltage the leakage current drops back to a low value again depicted at +0.7 Volt. Said sudden increase and said sudden drop back of leakage current are essential features for switching and deciding between different states.

According to the invention it is possible to operate the microelectronic device 10 as a very simple device or memory device, i.e. memory cell in a RAM due to and with the described underlying switching behavior. This will be illustrated in conjunction with FIGS. 13A to 3C and 4A to 4C.

Basically, by applying a write voltage pulse to the microelectronic device 10 the system is switched into a low resistance state which can be regarded as storing information. An erase voltage pulse recovers the resistance state of the microelectronic device 10 and the information is removed, i.e. erased.

As can be seen in FIG. 3A a series of 300 ms long different voltage pulses depicted as sharp peaks were applied to the electrodes (12, 16) of the microelectronic device 10.

A write pulse, also called second voltage pulse 6.1, that here is a negative pulse is used to write information which after a certain delay is removed by an erase pulse, also called first voltage pulse 5.1, that here is a positive pulse. In general, each first voltage pulse 5.1 leads to a first state 1, a high ohmic state, and on the other hand each second voltage pulse 6.1 leads to a second state 2, a low ohmic state, as can be seen from FIG. 3A in conjunction with FIG. 3C. Between the repeating voltage pulses 5.1, 6.1 a small negative read voltage 9 is switched on and off periodically to read the information and to simulate a realistic readout process. 120 reading cycles each having a duration of 1 sec are performed after each write or erase pulse. This readout procedure is schematically depicted in a better time resolution by the zoomed portion in FIG. 3A.

The readout from the microelectronic device 10 is performed by measuring the leakage current flowing at a small applied voltage of −0.2 V as it is depicted in FIG. 3B which shows current spikes occurring during write and erase followed by the readout period with currents one order of magnitude lower. FIG. 3C is a leakage current scale enlargement of FIG. 3B and clearly shows the above-mentioned first state 1 and second state 2.

Two different resistance states can be clearly separated: The first state 1 around 30 nano Amperes yielding a resistance of R=6.6 Mega Ohm and the second state 2 having a leakage current of 650 nano Amperes yielding a resistance of R=300 kilo Ohm. The first state 1 will now be associated with a logic state '0' and the second state 2 with a logic state '1'.

The '1' resistance value is 20 times smaller than the '0' value. A clear separation of the two logic states '1' and '0' is thus achieved.

Additionally, this remarkable dependence of the resistance on the applied voltage pulse 5.1, 6.1 together with the hysteretic behavior also allows to write different values to the microelectronic device 10 and to read them out with a single pre-specified read-out voltage. This so-called multilevel switching phenomenon is discussed later in more detail.

During the experimental measuring runs in this example information was written and erased during 300 ms—the duration of the sharp peaks—and stored for 240 s. The time to write and erase information was a specifically selected experimental parameter but is not limited by the memory device itself. Therefore, the ultimate speed for the write/erase process is much higher, as shown with reference to FIG. 5.

The time over which information can be stored is much longer than those 240 s measured experimentally, as further measurements confirmed that are shown in FIG. 5.

If one analyzes the switching behavior of such capacitor-like structures with varying Cr doping it can be observed that the switching behavior is more pronounced for slightly Cr doped structures, i.e. the best results are obtained with Cr-doping around 0.2% atomic percentage. For these capacitor-like structures the difference between '0' and '1' was the best with adequate reproducibility.

Summarizing the main aspects of the present invention includes a structure having a DC-resistance changing sensitively with the applied voltage pulses and consisting of oxides doped can be operated as a memory device or cell with the following intriguing properties:

What is achieved is a very simple structure because the whole memory cell is a capacitor-like structure. Thus they can be operated with only two terminals with a single terminal for read, write and erase. Thus, they are best adapted for ULSI technology.

Further, the difference in resistance between the '0'value and '1' value is at least one order of magnitude as can be seen from FIG. 3C. As can be seen further from the IVC depicted in FIG. 2A, a large resistance range can thus be exploited to store a plurality of different logical values, i.e., the so-called multilevel switching can be achieved. For this, a plurality of write pulses different in size, etc., as mentioned earlier can be applied to write specific logical values into the memory cell, in order to realize not a binary system but, e.g., a digital decimal system based on 10 different logical values being able to be written into and to be read from said memory cell in subsequent write/read/erase cycles.

Finally, the information is stored over long times which is a remarkable advantage compared to conventional DRAM cells.

Figure 4A:
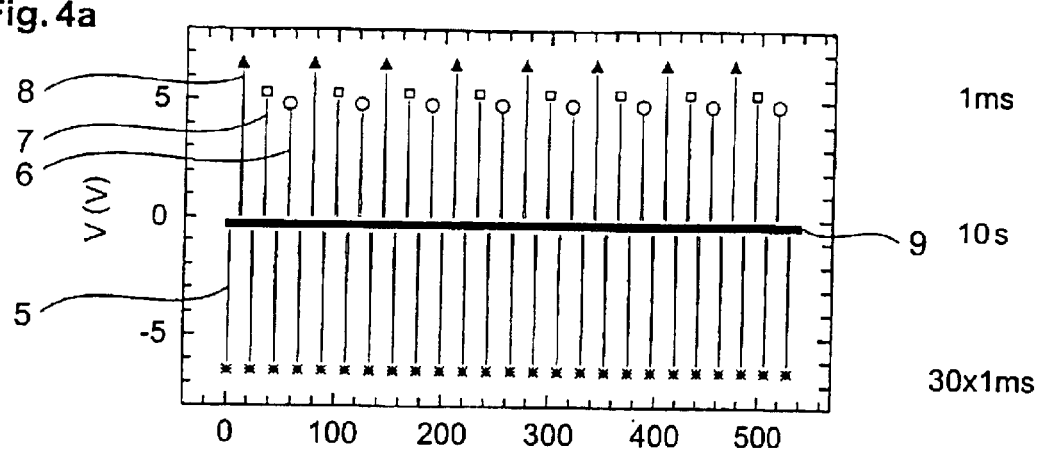
FIGS. 4A to 4C show the operation of a further microelectronic device as a multilevel memory device in accordance with the present invention.
Figure 4B:
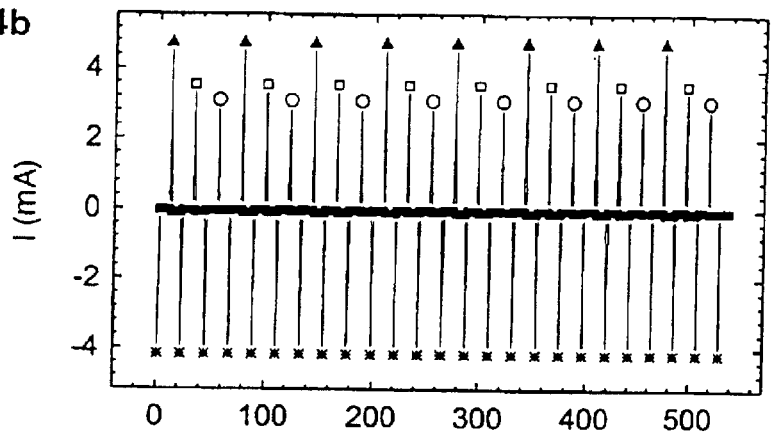
Figure 4C:
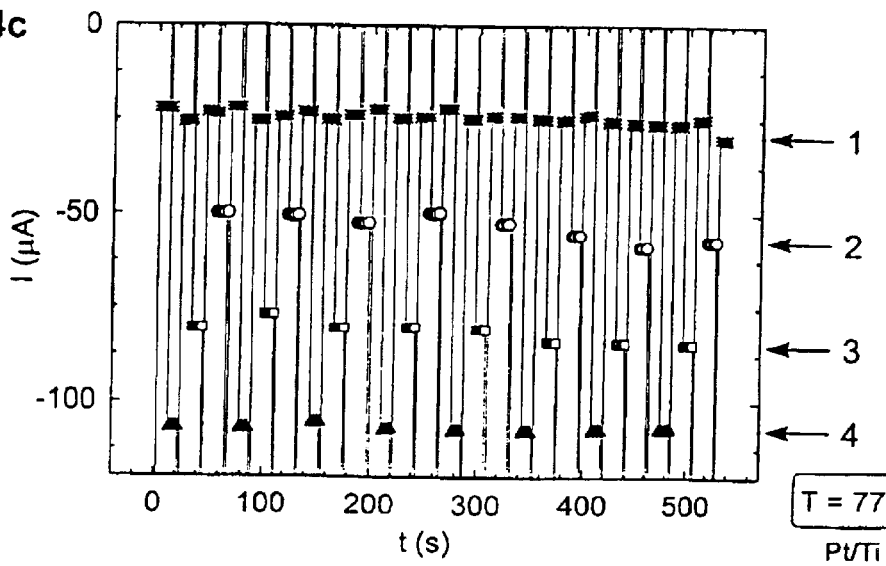

FIGS. 4A to 4C show the operation of a further microelectronic device, a second memory device, that can be used as a multilevel memory device. Since the FIGS. 4A to 4C are related to each other, they will be regarded in context to understand the operation of the second memory device. This second memory device for the sake of simplicity is not depicted but is structured as shown in FIG. 1. The second memory device comprising an oxide base electrode 12 made from SrRuO3 and a region 14 made from SrZrO3 slightly doped with 0.2% (atomic percentage) Chromium (Cr) for the insulating material and a metallic (Pt/Ti) top electrode 16 on a SrTiO3 substrate 18 was fabricated with pulsed laser deposition again.

As can be seen in FIG. 4A a series of different voltage pulses depicted as sharp peaks were applied to the second memory device. In particular, erase voltage pulses 5, low write pulses 6, medium write pulses 7, and high write pulses 8 were applied in a defined repeating sequence in order to simulate realistic erase and write processes. Each peak of the erase voltage pulses 5 indicates 30 pulses with a duration of 1 ms. A small read voltage 9 were applied appropriately in intervals of 10 s in order to read information., This read voltage 9 is smaller in magnitude than the different voltage pulses 5, 6, 7, 8 applied for switching to different states 1, 2, 3, 4.

FIG. 4B shows the current generated by the different voltage pulses 5, 6, 7, 8 and FIG. 4C the current readout enlargement of FIG. 4B. Different states 1, 2, 3, 4 corresponding to different ohmic resistances can be clearly derived from FIG. 4C. The ohmic resistance of the region 14 of the second memory device can be regarded as 'high' after one erase pulse 5 has been applied, that means that the second memory device then stores a high ohmic state, also referred to as first state 1. Conversely, each low write pulse 6 leads to a second state 2, each medium write pulse 7 leads to a third state 3, and each high write pulse 8 leads to a fourth state 4 whereby this fourth state 4 is the lowest ohmic state. The second state 2 and the third state 3 are in-between the high ohmic and the lowest ohmic state. As can be seen in FIG. 4A erase pulses 5 were applied between the write pulses 6, 7, 8 to switch respectively from the second state 2, the third state 3, or the fourth state 4 to the first state 1.

With each of the different states 1, 2, 3, 4 a corresponding logical value can be associated, e.g., the first state 1 corresponds to logical '00', the second state 2 corresponds to logical '01', the third state 3 corresponds to logical '10' and the fourth state 4 corresponds to logical '11', representing a 2 bit memory cell. In general, more states are possible than the depicted four different states 1, 2, 3, 4.

The erase voltage pulses 5 are here negative voltage pulses whereas the write pulses 6, 7, 8 are positive pulses. Basically, before a memory device is used the first time, an initializing voltage should be applied to polarize this device. Depending on this polarization the erase voltage pulses might either be positive and the write pulses negative or the erase voltage pulses are negative and the write pulses are positive.

It shows advantageously, if each of the erase pulses 5 has an equal or smaller magnitude of the amplitude of the write pulses 6, 7, 8.

Contrary to the example, the erase pulses 5 can have different amplitudes for switching directly from the fourth state 4 to the different states 3, 2, 1 having higher ohmic resistance. That means, in particular, for switching from a low ohmic state, that here is the fourth state 4, to a higher ohmic state, e.g. the third state 3, the second state 2, or even the first state 1, the erase pulses 5 have an adapted step-like increased amplitude. Also possible in such a way is a switching from the fourth state 4 directly to the second state 2.

The switching behavior of the multilevel memory device was investigated and tested at 77 K, whilst the same switching behavior can be realized at room temperature.

FIGS. 5A to 5H show results of measurements over an extended time period on another microelectronic device, a third memory device. This third memory device has the same structure as the second memory device as described above with the exception that the top electrode 12 comprises Au.

In general, within the uppermost row of figures the applied voltages are depicted whilst in the bottom row of figures the resulting current readouts are shown. FIG. 5a indicates two erase pulses 5 and three write pulses 6, each of a duration of 1 ms and applied in intervals of 1 min. The current readout with the corresponding states 1, 2 are depicted in FIG. 5B. A third positive write pulses 6 on the 28.4.99 leaded to a switch from the first state 1 to the second state 2, as can be seen from the figures. After that, the third memory device was stored without any power connection and not used for a longer period of time. FIGS. 5C and 5D indicate unperiodical measurements within a time period of two month, whereby the measuring dates are listed in FIG. 5D. More particular, FIG. 5C indicates the read voltage pulses 9 whereas FIG. 5D depicts the current readout result. The result shows that the second state 2 was stored over a longer period of time and thus the third memory device can be regarded as non-volatile for this time period. FIG. 5E shows further write and erase pulses, respectively, and FIG. 5F the resulting states. Finally, FIGS. 5G and 5H indicates further unperiodical measurements within a time period of three month, whereby the measuring dates are named in FIG. 5H. On one hand FIG. 5G depicts the read voltage pulses 9 again whereas on the other hand FIG. 5H shows the resulting current readout. The measurements show again that the last information stored in the third memory device was stored over a longer period of time without any decay.

Figure 6:
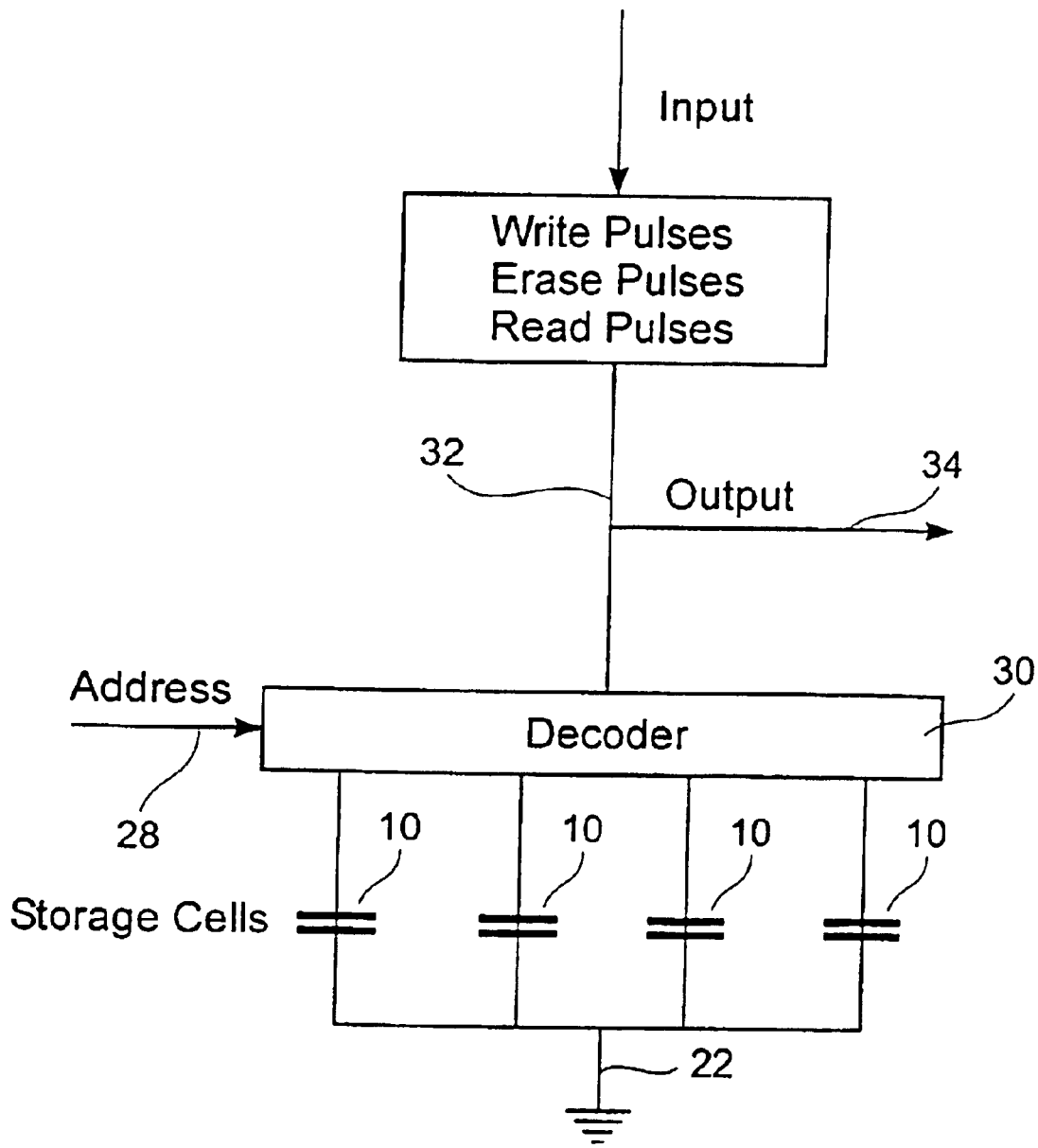
FIG. 6 shows a schematic circuit diagram representing the arrangement of a 4-bit-memory circuit in accordance with the present invention.

With reference to FIG. 6 a schematic circuit diagram representing the arrangement of a 4-bit-memory circuit is shown.

Four microelectronic devices 10, also referred to as memory cells 10, are arranged linearly in order to represent the 4-bit-memory circuit addressed via an address line 28 by a decoder 30 the outputs of which are connected to a respective top electrode 16, as shown in FIG. 1. The base electrodes 22 thereof are each connected to ground. A write, erase, or read voltage pulse can be applied to a selected memory cell 10 through a bias line 32. The different memory cells output current is evaluated through the output line 34.

In a similar way a matrix like arrangement can be achieved by connecting the base electrodes 22 of a row of the memory cells 10 with a further decoder.

It is obvious that the disclosed embodiments of the particular components 12, 14, 16, 18 of the capacitor-like structure on a chip, as shown in FIG. 1, will be adapted to the requirements imposed by the specific integration level which is intended to be achieved with the chip. A broad spectrum of different architectures can thus be realized.

Beside the capability of the memory cells 10 described above to store information it is possible to use a system comprising an doped capacitor-like structure as an active switching element in electric or electronic circuits.

In this area of interest a switching operation is not restricted to a specific resistance value. Devices having a resistance of some Mega Ohms can be operated at a voltage between 1 Volt and 5 Volt for writing and erasing and at a voltage between 0.05 Volt and 0.5 Volt for reading. Devices having a smaller resistance can also be operated, however at different voltages.

Further, the present concept is suitable for an application of the substance for constructing EEPROMs (Electrically Easable Programmable Read Only Memories), logic gates as e.g. AND gates, OR-gates, tunable capacitors and further complex logic circuits.

Particularly, when silicon (Si) or other semiconductor substrates are taken as substrate material instead of strontium titanate the current prior art semiconductor materials can be grown on the substrate thus providing the ability to join conventional semiconductor technology with the memory cells or switching elements, respectively, of the present concepts.

In the foregoing specification the invention has been described with reference to a specific exemplary embodiment thereof. It will, however, be evident that various modifications particularly relative to the application of a large variety of different substances as they are mentioned in the appended claims may be made thereto without departing from the broader spirit and scope of the invention as set forth in the appended claims.

The specification and drawings are accordingly to be regarded as illustrative rather than in a restrictive sense.

In particular the thickness of the region 14 as well as the lateral dimensions of a memory cell and the applied bias voltages or bias currents, respectively, can be varied as it is required by any specific purpose imposed by any of a plurality of varying chip designs.

Also the material selection for the bottom electrode can be varied as well. A simple metal like platinum (Pt) is suited as well.

Also for the top electrode the material can be varied as well. Au, Pt are suited materials, but principally, all metals and conducting oxides are suited materials for both, top and bottom electrodes.

It is to be understood that the present invention is not limited to the embodiments described above, but encompasses any and all embodiments within the scope of the following claims:

What is claimed is:

1. A microelectronic device for storing digital information, the device having a switchable ohmic resistance between electrodes, which said ohmic resistance is reversibly switchable between different states in response to application of different voltage pulses to the electrodes, each different state corresponding to a different value of stored information; wherein the ohmic resistance is formed from a substance comprising components $A_x$, $B_y$, and oxygen $O_z$, in which:

said component A is a member of Alkaline metals (group IA), or Alkaline Earth metals (group IIA), or Rare Earth elements, or Scandium, or Yttrium; said component B is a transition metal being member of one of the groups IB to VIII, or a member of one of the groups IIIA, IVA, VA; and said substance comprising a dopant of one of or a combination of different transition metals, the total dopant amount in atomic percentage being larger than 0% and smaller than 5%.

2. The microelectronic device according to claim 1, wherein the ohmic resistance is switchable between at least a first state of the different states and a second state of the different states by applying to the electrodes a first voltage pulse of the different voltage pulses for switching from said second state to said first state or a second voltage pulse of the different voltage pulses for switching from said first state to said second state.

3. The microelectronic device according to claim 2, wherein the ohmic resistance in the first state is higher than in the second state and wherein the first voltage pulse of the different voltage pulses for switching to said first state has an opposite sign to the second pulse of the different voltage pulses for switching to said second state.

4. The microelectronic device according to claim 1, wherein each of the different states is obtainable by an erase pulse for switching the ohmic resistance in the region to a high ohmic state of the different states or by providing at least one write pulse for switching from said high ohmic state to a lower ohmic state of the different states.

5. The microelectronic device according to claim 4, wherein the erase pulse has different amplitudes for switching to one of the lower ohmic states.

6. The microelectronic device according to claim 1, wherein the different states are readable by a read voltage smaller in magnitude than the different voltage pulses applied for switching to the different states.

7. The microelectronic device according to claim 1 being usable as a capacitor-like structure, wherein the ohmic resistance represents a dielectric.

8. The microelectronic device according to claim 1, whereby a specific ohmic resistance related to one of the different states remains after one of the different voltage pulses that leads to said specific ohmic resistance has been applied to the electrodes.

9. The microelectronic device according to claim 1, wherein said stored digital information is representable by different values in ohmic resistance of a region, thereby preferably storing two or more bits as digital information.

10. The microelectronic device according to claim 1, in which the combinations of indices x, y and z of the substance are definable by x=n+2, y=n+1, z=3n+4, with n=0, 1, 2, 3; or x=n+1, y=n+1, z=3n+5, with n=1, 2, 3, 4.

11. The microelectronic device according to claim 1, in which the combinations of indices x, y and z of the substance are definable by either of:

x=1, y=1, z=1, and one of the indices x or y being 0; or x=n, y=n, z=n+1, with n=1 or 2 and one of the indices x or y being 0; or x=n, y=n, z=2n+1, with n=2 and one of the indices x or y being 0.

12. The microelectronic device according to claim 1, in which the combinations of indices x, y and z of the substance are definable by x=n, y=n, z=3n, with n=1, or 2, or 3; or x=n+1, y=n, z=4n+1, with n=1, or 2.

13. The microelectronic device according to claim 1, comprising a dopant of Chromium or Vanadium at an amount in atomic percentage larger than 0% and smaller than 5%.

14. The microelectronic device according to claim 1, wherein at least one of the components $A_x$ or $B_y$ of the substance comprises a combination of elements out of one group or out of several of the corresponding groups of A, and B, respectively.

15. The microelectronic device according to claim 11, wherein the substance is present in the form of a superlattice made by a combination of structural unit cells and/or sub-unit cells.

16. The microelectronic device according to claim 10, wherein the substance is present in the form of a superlattice made by a combination of structural unit cells and/or sub-unit cells having each a different n, said structural unit cells and/or sub-unit cells being each a member of a corresponding homologous series.

17. The microelectronic device according to claim 12, wherein the substance is present in the form of a superlattice made by a combination of structural unit cells and/or sub-unit cells having each a different n, said structural unit cells and/or sub-unit cells being each a member of a corresponding homologous series.

18. A memory cell arrangement comprising a microelectronic device, said microelectronic device having a switchable ohmic resistance between electrodes, which said ohmic resistance is reversibly switchable between different states in response to application of different voltage pulses to the electrodes, each different state corresponding to a different value of stored information; wherein the ohmic resistance is formed from a substance comprising components $A_x$, $B_y$, and oxygen $O_z$, in which:

said component A is a member of Alkaline metals (group IA), or Alkaline Earth metals (group IIA), or Rare Earth elements, or Scandium, or Yttrium;

said component B is a transition metal being member of one of the groups IB to VIII, or a member of one of the groups IIIA, IVA, VA; and said substance comprising a dopant of one of or a combination of different transition metals, the total dopant amount in atomic percentage being larger than 0% and smaller than 5%.

19. A semiconductor device comprising a microelectronic device, said microelectronic device having a switchable ohmic resistance between electrodes, which said ohmic resistance is reversibly switchable between different states in response to application of different voltage pulses to the electrodes, each different state corresponding to a different value of stored information; wherein the ohmic resistance is formed from a substance comprising components $A_x$, $B_y$, and oxygen $O_z$, in which:

said component A is a member of Alkaline metals (group IA), or Alkaline Earth metals (group IIA), or Rare Earth elements, or Scandium, or Yttrium;

said component B is a transition metal being member of one of the groups IB to VIII, or a member of one of the groups IIIA, IVA, VA; and said substance comprising a dopant of one of or a combination of different transition metals, the total dopant amount in atomic percentage being larger than 0% and smaller than 5%.

20. A method for writing information into a memory cell arrangement, said memory cell arrangement comprising a microelectronic device having a switchable ohmic resistance between electrodes, which said ohmic resistance is reversibly switchable between different states in response to application of different voltage pulses to the electrodes, each different state corresponding to a different value of stored information; wherein the ohmic resistance is formed from a substance comprising components $A_x$, $B_y$, and oxygen $O_z$, in which: said component A is a member of Alkaline metals (group IA), or Alkaline Earth metals (group IIA), or Rare Earth elements, or Scandium, or Yttrium; said component B is a transition metal being member of one of the groups IB to VIII, or a member of one of the groups IIIA, IVA, VA; and said substance comprising a dopant of one of or a combination of different transition metals, the total dopant amount in atomic percentage being larger than 0% and smaller than 5%, wherein the method comprising the step of:

applying one voltage pulse of the different voltage pulses to the electrodes of said memory cell arrangement for writing information into it.

21. The method according to claim 20, further comprising the step of switching the ohmic resistance in the region between at least a first state of the different states and a second state of the different states by applying to the electrodes a first voltage pulse of the different voltage pulses for switching from said second state to said first state or a second voltage pulse of the different voltage pulses for switching from said first state to said second state.

22. The method according to claim 21, further comprising the step of providing an ohmic resistance in the first state higher than an ohmic resistance in the second state and providing the first voltage pulse for switching to said first state with an opposite polarity to the second voltage pulse for switching to said second state.

23. The method according to claim 20, further comprising the step of obtaining each of the different states by providing an erase pulse for switching the ohmic resistance to a high ohmic state of the different states or by providing at least one write pulse for switching from said high ohmic state to a lower ohmic state of the different states.

24. The method according to claim 23, further comprising the step of providing an erase pulse with different amplitudes for switching to one of the lower ohmic states.

25. A method for reading information out of a memory cell arrangement, said memory cell arrangement comprising a microelectronic device having a switchable ohmic resistance between electrodes, which said ohmic resistance is reversibly switchable between different states in response to application of different voltage pulses to the electrodes, each different state corresponding to a different value of stored information; wherein the ohmic resistance is formed from a substance comprising components $A_x$, $B_y$, and oxygen $O_z$, in which: said component A is a member of Alkaline metals (group IA), or Alkaline Earth metals (group IIA), or Rare Earth elements, or Scandium, or Yttrium; said component B is a transition metal being member of one of the groups IB to VIII, or a member of one of the groups IIIA, IVA, VA; and said substance comprising a dopant of one of or a combination of different transition metals, the total dopant amount in atomic percentage being larger than 0% and smaller than 5%, wherein the method comprising the steps of:

applying a read voltage to said memory cell arrangement and associating with this information a value of current flowing through said memory cell arrangement; or applying a current pulse to said memory cell arrangement and associating with this information a value of voltage appearing between the electrodes of said memory cell arrangement.

26. Use of a substance for storing digital information, the substance comprising components $A_x$, $B_y$, and oxygen $O_z$, for making a switchable ohmic resistance within a capacitor-like structure, in which:

said component A is a member of Alkaline metals (group IA), or Alkaline Earth metals (group IIA), or Rare Earth elements, or Scandium, or Yttrium, said component B is a transition metal being member of one of the groups IB to VIII, or a member of one of the groups IIIA, IVA, VA, said substance comprises a dopant of one of or a combination of different transition metals, the total dopant amount in atomic percentage being larger than 0% and smaller than 5%.

27. Use of a substance according to the claim 26, wherein the combinations of indices x, y and z are defined by $x=n+2$, $y=n+1$, $z=3n+4$, with $n=0, 1, 2, 3$; or $x=n+1$, $y=n+1$, $z=3n+5$, with $n=1, 2, 3, 4$; or being defined by either of:

$x=1$, $y=1$, $z=1$, and one of the indices x or y being 0, or $x=n$, $y=n$, $z=n+1$, with $n=1$ or 2 and one of the indices x or y being 0, or $x=n$, $y=n$, $z=2n+1$, with $n=2$ and one of the indices x or y being 0; or being defined by $x=n$, $y=n$, $z=3n$, with $n=1$, or 2, or 3; or $x=n+1$, $y=n$, $z=4n+1$, with $n=1$, or 2.

* * * * *